(12) United States Patent
Van Houdt et al.

(10) Patent No.: US 10,211,312 B2
(45) Date of Patent: Feb. 19, 2019

(54) FERROELECTRIC MEMORY DEVICE AND FABRICATION METHOD THEREOF (71) Applicant: IMEC VZW, Leuven (BE)

(72) Inventors: Jan Van Houdt, Bekkevoort (BE); Voon Yew Thean, Brussels (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/230,289

(22) Filed: Aug. 5, 2016

(65) Prior Publication Data

US 2017/0040331 A1 Feb. 9, 2017

(30) Foreign Application Priority Data

Aug. 7, 2015 (EP) ..................... 15180192

(51) Int. Cl.
*H01L 29/51* (2006.01)
*H01L 29/78* (2006.01)
*H01L 29/66* (2006.01)
*H01L 21/28* (2006.01)
*H01L 21/02* (2006.01)

(52) U.S. Cl.
CPC ...... *H01L 29/516* (2013.01); *H01L 21/28291* (2013.01); *H01L 29/6684* (2013.01); *H01L 29/78391* (2014.09); *H01L 21/0242* (2013.01); *H01L 21/02425* (2013.01); *H01L 21/02568* (2013.01)

(58) Field of Classification Search
CPC ............. H01L 29/1033; H01L 29/6684; H01L 21/02568; H01L 29/78681; H01L 29/516; H01L 21/28291; H01L 29/78391; H01L 21/02425; H01L 21/0242
See application file for complete search history.

(56) References Cited

U.S. PATENT DOCUMENTS

2009/0189152 A1* 7/2009 Cho ................. B82Y 10/00
 257/40
2011/0170330 A1* 7/2011 Oezyilmaz ............ B82Y 10/00
 365/145

(Continued)

OTHER PUBLICATIONS

Kim, Woo-Hee, and Jong Yeog Son. "Single-Layer MoS2 Field Effect Transistor with Epitaxially Grown SrTiO3 Gate Dielectric on Nb-doped SrTiO3 Substrate." Bulletin of the Korean Chemical Society 34.9 (2013): 2563-2564.*

(Continued)

*Primary Examiner* — Victor A Mandala
(74) *Attorney, Agent, or Firm* — Knobbe, Martens, Olson & Bear LLP (57) ABSTRACT

The disclosed technology generally relates to semiconductor devices, and more particularly to a non-volatile ferroelectric memory device and to methods of fabricating the same. In one aspect, a non-volatile memory device includes a high dielectric constant layer (high-k) layer or a metal layer on a semiconductor substrate. The non-volatile memory device additionally includes a two-dimensional (2D) semiconductor channel layer interposed between the high-k layer or metal layer and a ferroelectric layer. The non-volatile memory device additionally includes a metal gate layer on the ferroelectric layer, and further includes a source region and a drain region each electrically coupled to the 2D semiconductor channel layer.

22 Claims, 3 Drawing Sheets

(56) References Cited

U.S. PATENT DOCUMENTS

| | | | | |
|---|---|---|---|---|
| 2012/0305891 A1* | 12/2012 | Nayfeh | ............... | H01L 29/1606 257/26 |
| 2013/0001518 A1* | 1/2013 | Lin | .................... | H01L 29/1606 257/29 |
| 2014/0197459 A1* | 7/2014 | Kis | ................... | H01L 29/66742 257/194 |
| 2014/0231888 A1* | 8/2014 | Kelber | ................... | H01L 29/78 257/295 |
| 2016/0141366 A1* | 5/2016 | Lai | .................... | H01L 29/1033 257/9 |

OTHER PUBLICATIONS

Lee, Hee Sung, et al. "MoS2 Nanosheets for Top-Gate Nonvolatile Memory Transistor Channel." Small 8.20 (2012): 3111-3115.*

Zhang, Enze, et al. "Tunable charge-trap memory based on few-layer MoS2." ACS nano 9.1 (2014): 612-619.*

Wang, Xudong, et al. "Ultrasensitive and broadband MoS2 photodetector driven by ferroelectrics." Advanced Materials 27.42 (2015): 6575-6581.*

Li, Hai, et al. "Gate-Voltage-Controlled Spin and Valley Polarization Transport in a Normal/Ferromagnetic/Normal MoS2 Junction." ACS applied materials & interfaces 6.3 (2014): 1759-1764.*

Lomenzo, Patrick D., et al. "The effects of layering in ferroelectric Si-doped HfO2 thin films." Applied Physics Letters 105.7 (2014): 072906.*

Zheng, Yi, et al. "Gate-controlled nonvolatile graphene-ferroelectric memory." Applied Physics Letters 94.16 (2009): 163505.*

Hwang, Hyeon Jun, et al. "Ferroelectric polymer-gated graphene memory with high speed conductivity modulation." Nanotechnology 24.17 (2013): 175202.*

Liu, Han, and D. Ye Peide. "MoS2 Dual-Gate MOSFET With Atomic-Layer-Deposited Al2O3 as Top-Gate Dielectric." IEEE Electron Device Letters 33.4 (2012): 546-548.*

Lembke, Dominik, and Andras Kis. "Breakdown of high-performance monolayer MoS2 transistors." ACS nano 6.11 (2012): 10070-10075.*

* cited by examiner

FERROELECTRIC MEMORY DEVICE AND FABRICATION METHOD THEREOF

CROSS-REFERENCE TO RELATED APPLICATIONS

This application claims foreign priority to European application EP 15180192.5, filed Aug. 7, 2015, the content of which is incorporated by reference herein in its entirety.

BACKGROUND

Field

The disclosed technology generally relates to semiconductor devices, and more particularly to a non-volatile ferroelectric memory device and to methods of fabricating the same.

Description of the Related Technology

Memories and in particular non-volatile memories are in great demand, for instance for being used in high-performance digital cameras, mp3 players, flash drives and cards, mobile phones, personal digital assistants (PDAs) and ultra-portable notebook personal computers (PCs) where high-density, ultra-compact, and low power-consumption storage devices are needed to replace the use of bulky hard disk drives. With new applications coming up, such as distributed sensor nodes and the concept of the internet of things, future ICs will need local memory that is very low-power operable, as well as switching at low currents.

An example of a well-known non-volatile memory is flash memory; however, a main disadvantage thereof is that flash memory devices need high voltages (20V) for writing and erasing processes, which are incompatible with the CMOS baseline.

Another non-volatile memory which has attracted great attention from the research community as a good candidate for both memory and switching applications is the ferroelectric field-effect transistor (FeFET) memory device. A state-of-the-art FeFET memory device resembles very much a metal-oxide-semiconductor FET (MOSFET); however the gate oxide dielectric is replaced by a ferroelectric material for a FeFET memory device. By modulating the gate electrode accumulation or depletion at the ferroelectric-semiconductor (channel) interface will occur and thereby switch the FeFET on or off.

A one transistor (1T) ferroelectric memory cell has been proposed and experimentally studied in order to reduce the size of 1T-1C design with consequent advantages in terms of size, read-out operation and costs. However, one main drawback of FeFETs known in the art is their non-perfect non-volatile behavior: when the ferroelectric material, which serves as the gate dielectric, is programmed, the gate dielectric is polarized in such a way that the threshold voltage is shifted, similar to a flash device. However, since now the charge causing this effect is polarization charge, caused by an atom moving within the unit cell of the ferroelectric crystal, there is no direct leakage current causing the cell to discharge. There is, however, another effect causing the information to leak away, which is referred to as the depolarization field. In most cases the electric field over the materials in contact with the ferroelectric material can be different from zero even in the retention condition when no voltage is applied. As a consequence, there will also be an electric field over the ferroelectric material which is always opposite to the polarization (Gauss' law). That induced electric field will disadvantageously work against the polarization and hence depolarize the cell causing it to lose its content, thus resulting in poor non-volatile properties.

Therefor there is a need for novel and improved ferroelectric memory cells.

SUMMARY OF CERTAIN INVENTIVE ASPECTS

Memories and in particular non-volatile memories are in great demand, for instance for being used in high-performance digital cameras, mp3 players, flash drives and cards, mobile phones, personal digital assistants (PDAs) and ultra-portable notebook personal computers (PCs) where high-density, ultra-compact, and low power-consumption storage devices are needed to replace the use of bulky hard disk drives. With new applications coming up, such as distributed sensor nodes and the concept of the internet of things, future ICs will need local memory that is very low-power operable, as well as switching at low currents.

An example of a well-known non-volatile memory is flash memory; however, a main disadvantage thereof is that flash memory devices need high voltages (20V) for writing and erasing processes, which are incompatible with the CMOS baseline.

Another non-volatile memory which has attracted great attention from the research community as a good candidate for both memory and switching applications is the ferroelectric field-effect transistor (FeFET) memory device. A state-of-the-art FeFET memory device resembles very much a metal-oxide-semiconductor FET (MOSFET); however the gate oxide dielectric is replaced by a ferroelectric material for a FeFET memory device. By modulating the gate electrode accumulation or depletion at the ferroelectric-semiconductor (channel) interface will occur and thereby switch the FeFET on or off.

A one transistor (1T) ferroelectric memory cell has been proposed and experimentally studied in order to reduce the size of 1T-1C design with consequent advantages in terms of size, read-out operation and costs. However, one main drawback of FeFETs known in the art is their non-perfect non-volatile behavior: when the ferroelectric material, which serves as the gate dielectric, is programmed, the gate dielectric is polarized in such a way that the threshold voltage is shifted, similar to a flash device. However, since now the charge causing this effect is polarization charge, caused by an atom moving within the unit cell of the ferroelectric crystal, there is no direct leakage current causing the cell to discharge. There is, however, another effect causing the information to leak away, which is referred to as the depolarization field. In most cases the electric field over the materials in contact with the ferroelectric material can be different from zero even in the retention condition when no voltage is applied. As a consequence, there will also be an electric field over the ferroelectric material which is always opposite to the polarization (Gauss' law). That induced electric field will disadvantageously work against the polarization and hence depolarize the cell causing it to lose its content, thus resulting in poor non-volatile properties.

Therefor there is a need for novel and improved ferroelectric memory cells.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it will be understood that embodiments of the disclosure may be practiced without these specific details. In other instances, well-known methods, structures and techniques have not been shown in detail in order not to obscure an understanding of this description.

As described herein, "a high-k layer" refers to a dielectric layer with a dielectric constant larger than $SiO_2$, which is about 3.9 or about 4.

As described herein, two layers that are in direct contact refers to an arrangement where two contacting layers have no other intervening layer(s) present. That is, a direct physical contact between the two layers.

As described herein, a two-dimensional (2D) semiconductor layer refers to a semiconductor layer comprising a 2D material. Such materials have interesting properties in terms of mobility and parasitics and therefore allow for future scaling of transistor performance.

In some embodiments, a 2D material may have a dimension in one direction that is smaller than dimensions in other orthogonal directions, such that at least one physical property in the one direction may be different compared to the physical property in the other orthogonal directions. For example, physical properties that may be direction-dependent include band gap, electrical and/or thermal conductivities, density of states, carrier mobilities, etc. For example, when a 2D material is formed as a sheet in a plane formed by x and y directions and has a dimension in an orthogonal z direction that is sufficiently smaller compared to dimensions in the x and y directions, the 2D material may have a band gap that is different, e.g., greater, than a band gap in x and/or y directions.

In some embodiments, 2D material may be a material having a layered structure, where atoms of the 2D material may have one type of bonding in x and y directions while having a different type of bonding in the z direction. For example, the atoms of the 2D material may be covalently bonded in x and y directions while being weakly bound, e.g., by Van der Waals forces, in the z direction.

In some embodiments, a 2D material is formed as a regular network in two dimensions and may be referred to as a single layer material or monolayer-type material (wherein a monolayer-type material can include up to a few monolayers). Examples of a 2D material include transition metal dichalcogenides, or $MX_2$, where M a transition metal element and X is a chalcogenide element. According to embodiments, the $MX_2$ material may include $WS_2$, $MoS_2$, $WSe_2$, $MoSe_2$ or combinations thereof. These materials may be used when a relatively large (e.g., >100 meV) band gap is desired in the channel. Another example of a 2D material is graphene, according to embodiments. Graphene may be used when a relatively small (e.g., 100 meV or less) band gap is desired in the channel. However, it will be appreciated that a smaller bandgap may lead to relatively higher leakage current in the OFF state. That is, under some circumstances, the leakage current in the OFF state nay be smaller in devices having $MX_2$ materials as the channel material, compared to devices having graphene as the channel material. Graphene can be metallic with zero bandgap or semiconducting with non-zero bandgap (such as for example bilayer graphene). The bandgap of the 2D material according to embodiments of the present disclosure preferably is higher than the bandgap of graphene, e.g., higher than about 100 meV.

Figure 1:
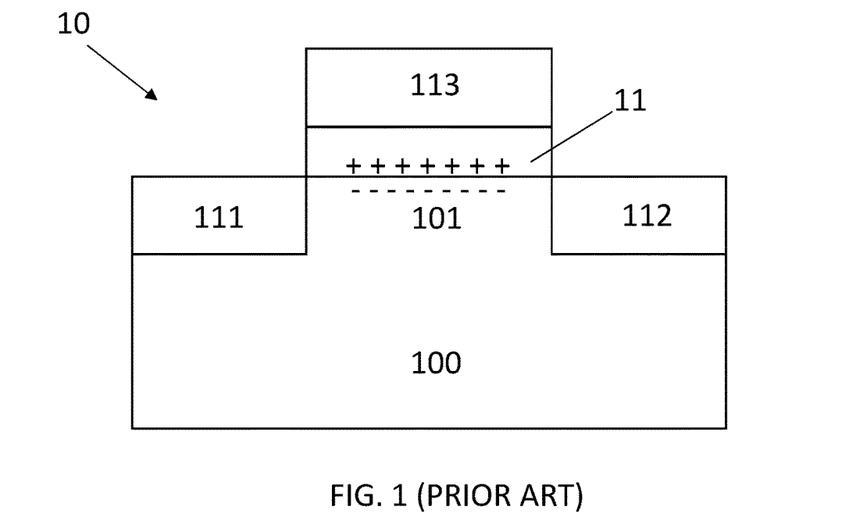
FIG. 1 schematically illustrates a prior art FeFET memory device.
Figure 2:
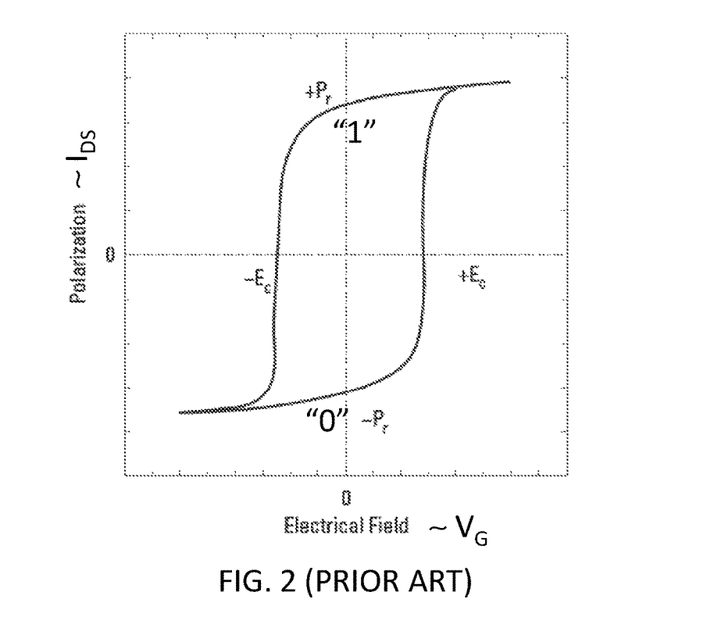
FIG. 2 illustrates a schematic example of a hysteresis loop in a FeFET memory device as illustrated in FIG. 1.

A ferroelectric (FeFET) memory device 10 is a memory device which makes use of a ferroelectric layer 11, such as for instance lead zirconate titanate (PZT) for storing data. FIG. 1 illustrates an n-type FeFET. By applying an external electric field to the memory device 10, e.g., a gate voltage to the gate electrode 113, a field-induced modulation of a conductivity of the channel of the memory device 10 may be achieved, e.g., by causing an accumulation or a depletion of majority carriers and/or an inversion of minority carriers to occur at the interface between the ferroelectric layer 11 and the semiconducting channel 101. The $I_{DS}$-$V_G$ (source-drain current versus gate voltage) curve which corresponds to the hysteretic loop of such a device is shown in FIG. 2. Upon applying a sufficient gate voltage to the gate electrode 113, polarization of the ferroelectric layer 11 is induced, and the memory device 10 turns on ("1" state) or off ("0" state). The gate voltage at which the polarization of the ferroelectric layer 11 is induced corresponds to voltage at which a critical electric field Ec is applied to the ferroelectric layer 11, at or above which a non-volatile or a permanent change in polarization is induced in the ferroelectric layer 11. When the gate voltage is removed, the memory device 10 retains its memory state, according to embodiments. These states correspond to the so-called remnant polarization +Pr and −Pr respectively. The bistable state of a ferroelectric can thus be programmed as a binary information ("1" or "0"). This is due to the displacement of charges which is inherent to the crystal structure of the ferroelectric material and does not disappear in the absence of the electric field or gate voltage applied. This is why ferroelectric materials are very suitable for use in low-power non-volatile memories. In addition, the direction of the polarization P can be reversed or reoriented by applying an appropriate electric field (gate voltage).

As illustrated in FIG. 1, some ferroelectric memory devices do not have the desired long-term non-volatility. The information leaking away is due to a depolarization field being present, as already stated above. As described herein, long term non-volatility may refer to situations where the remnant polarization +/−Pr changes by less than about 10%, 20% or about 50% after about 1 month, after about 1 year, or after about 10 years, according to various embodiments.

The inventors have discovered that poor non-volatility can result when the materials in contact with the ferroelectric have a low permittivity. Since Si has a low permittivity of about 12, and most ferroelectric materials have high permittivity values, this leakage situation is bound to occur in any ferroelectric memory device using silicon as a channel material, such as the example illustrated in FIG. 1. This is the main reason why ferroelectric memory devices have not made it into the market place so far.

Figure 3:
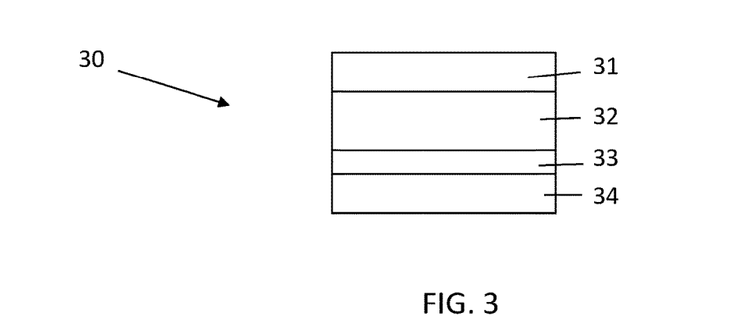
FIG. 3 illustrates a ferroelectric memory device according to embodiments of the present disclosure.

To solve this problem, in a first aspect, embodiments of the present disclosure provide a non-volatile memory cell 30, comprising at least a ferroelectric layer 32, a high-k layer 34, and a two-dimensional (2D) semiconductor channel layer 33 formed between the ferroelectric layer 32 and the high-k layer 34. In some implementations, the high-k layer may be replaced by a metal layer. The metal layer may comprise for example TiN, TaN, Cu, Al, W or another metal material suitable for a gate electrode known for a person skilled in the art. It is an advantage of various embodiments disclosed herein that a high-k layer or a metal layer that is present below the 2D semiconductor channel layer 33 is configured to prevent a depolarization field in the ferroelectric device. It is an advantage that a high-k layer is more easily integrated (compared to a metal layer) in a process flow for manufacturing a ferroelectric device. High thermal budgets can be circumvented in case of a high-k layer by using lift-off techniques, whereas this is not evident for a metal layer.

Throughout the further description where a high-k layer is mentioned, it should be interpreted that the high-k layer may be replaced by a metal layer.

According to embodiments, there is no low-k dielectric layer (i.e. a dielectric layer having a k-value lower than the k-value of $SiO_2$, i.e. 3.9 or 4 rounded) under the 2D semiconductor channel layer 33 in order not to have a voltage drop over that layer.

By using a 2D material as a channel material, the appearance of a voltage drop over the stack can be avoided, whereby the depolarization field is brought back to zero. This way, a high quality FeFET is created, which has a long retention time. In order to maintain the zero depolarization field, the 2-dimensional channel 33 needs to be deposited on top of a high-k layer 34.

An example of a non-volatile memory cell 30 in accordance with embodiments of the present disclosure is illustrated in FIG. 3.

At the bottom, a high-k (high-k) layer or a metal layer 34 is provided, typically on a substrate (not shown). This layer can be made from any suitable high-k material, such as for instance STO (strontium titanate). High-k materials, for instance STO, can be provided via thin film deposition techniques such as atomic layer deposition (ALD).

In preferred embodiments the dielectric constant of the high-k layer 34 should be at least 4 to 5 times higher than the k-value of ferroelectric layer.

The 2D semiconductor channel layer 33 may be in direct contact with the high-k layer 34. Materials of the 2D semiconductor channel layer 33 may be materials with non-zero energy bandgap. Examples are transition metal chalcogenides, whereby the molecular structure of this class of materials can be expressed with a general formula as $MX_2$, wherein M is a transition metal and X a chalcogenide. Particular materials of this type are for instance $MoS_2$, $MoSe_2$, $MoTe_2$, $WS_2$, $WSe_2$, or $WTe_2$. The 2D material does not comprise graphene, according to some embodiments.

Deposition of the 2D semiconductor channel layer 33 can be done by any suitable deposition method such as for example atomic layer deposition (ALD) which allows a very good thickness control. Also exfoliation may be used.

In some embodiments, the 2D semiconductor channel layer 33 is formed of one discrete monolayer. In some embodiments, the 2D semiconductor channel layer 33 consists of one discrete monolayer. However, it will be appreciated that, for reasons of coverage, the 2D semiconductor channel layer 33 may be formed of a few monolayers, such as 5 layers or less, for instance 2 layers or 3 layers. In some embodiments, the 2D semiconductor channel layer 33 consists of a few monolayers, such as 5 layers or less, for instance 2 layers or 3 layers. In some embodiments, the thickness of the 2D semiconductor channel layer 33 is preferably less than 1 nm. In various embodiments, the thickness of the 2D semiconductor channel layer 33 is between 1 monolayer and 1 nm It will be appreciated that, in some embodiments, the 2D semiconductor layer 33 has a thickness such that a conductivity of the 2D semiconductor material can be controlled by a field-induced modulation of minority carrier concentration in the 2D semiconductor material.

The ferroelectric layer 32 is provided on top of the 2D semiconductor channel layer 33. The ferroelectric layer 32 may be in direct contact with the 2D semiconductor channel layer 33. Using a ferroelectric material as gate dielectric on top of a 2D semiconductor channel suppresses the depolarization field by geometry: since the channel 33 is ultrathin (only a few tenths of a nm), there is hardly any voltage drop over it. Consequently no electrical field will appear across the ferroelectric layer 32. This way, a good retention is obtained.

According to various embodiments, the ferroelectric layer 32 comprises a single transition metal oxide such as hafnium oxide (e.g., $HfO_2$), aluminum oxide (e.g., $Al_2O_3$), zirconium oxide (e.g., $ZrO_2$), titanium oxide (e.g., $TiO_2$), niobium oxide ($Nb_2O_5$), tantalum oxide ($Ta_2O_5$), tungsten oxide ($WO_3$), molybdenum oxide ($MO_3$), vanadium oxide ($V_2O_3$) among other single transition metal oxides, to name a few. In other embodiments, the vertical ferroelectric layer 32 comprises a binary, a ternary, a quaternary or a higher transition metal oxide which includes two, three, four or more metals forming the transition metal oxide The high-k layer 34 and the ferroelectric layer 32 have dielectric constants k1 and k2, respectively, and physical thicknesses t1 and t2, respectively. If one would choose the same physical layer thickness for both layers (i.e. t1=t2), the k-value k1 of the high-k layer should be chosen to be higher than the k-value k2 of the ferroelectric layer (k1>k2). The value of k1 is greater by a factor 4-5 than k2, according to embodiments. For example, the ferroelectric layer 32 may comprise a 5 nm (t2) ferroelectric $HfO_2$ layer (in orthorhombic phase) (k2~25) and the high-k layer 34 may then comprise a few nanometers (t1~t2) of STO which has a k-value (k1) of about 100. A ferroelectric $HfO_2$ layer may be a $HfO_2$ which is doped for example with Si, Al, Y, Gd, and Sr. Alternatively worded: the equivalent oxide thickness (EOT) of the high-k layer 34 should be larger, preferably at least 10 times larger, than the EOT of the ferroelectric layer 32.

In the embodiment illustrated in FIG. 3, on top of the ferroelectric layer 32 a gate electrode 31 is provided. The gate electrode may be a metal gate electrode.

In a particular embodiment, the present disclosure not being limited thereto, the ferroelectric cell stack as illustrated in FIG. 3 comprises a few nm of TiN as metal gate 31, a 5 nm Al-doped $HfO_2$ in orthorhombic phase as ferroelectric layer 32, a $MoS_2$ 2D semiconductor channel layer 33, and a few nm's of STO (with k value about 100) as high-k layer 34.

Figure 4:
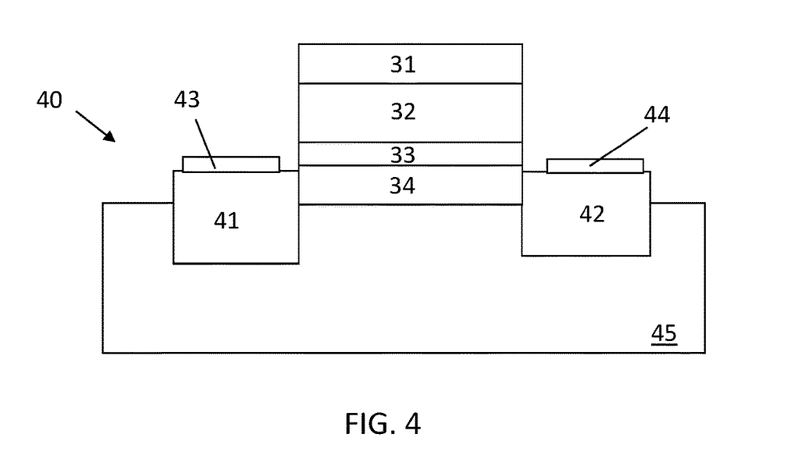
FIG. 4 illustrates a FeFET memory device according to embodiments of the present disclosure.

FIG. 4 illustrates the use of a non-volatile memory stack in accordance with embodiments of the present disclosure in a FET device 40. The FET device then comprises, on top of the memory stack 30 as in FIG. 3, a source region 41 and a drain region 42. The 2D semiconductor channel layer 33 forms a channel region between the source region 41 and the drain region 42. A gate electrode 31 is provided on top of the ferroelectric material 32. The gate electrode 31 functions as a word line when reading or writing the memory cell. Source and drain electrodes 43, 44 are provided on top of and in electrical contact with the source and drain regions 41, 42, respectively. The source and drain electrodes 43, 44 function as bit lines when reading or writing the memory cell.

It will be appreciated that, according to embodiments, the channel layer 33 is formed of the channel layer 33, which is a non-silicon material. In addition, when the substrate 45 is formed of silicon, it may not serve as the channel of the FET device 40. While in FIG. 4, the source and drain regions 41, 42 are shown as being in contact with the high k layer 34, it will be appreciate that the source and drain regions 41, 42 may further contact the 2D semiconductor channel layer 22.

It is an advantage of embodiments of the present disclosure that 2-dimensional materials can be stacked on top of one another. Therefore, in accordance with embodiments of the present disclosure, a memory layer according to embodiments of the present disclosure can be provided on top of a logic layer, and both can be electrically connected, for instance by means of vias.

Logic layers and memory layers, both based on ferroelectric materials, have a similar structure, the main difference being the thickness of the ferroelectric layer: memory cells have thicker ferroelectric layers than logic cells. Due to the similarity between both, the compatibility, both in manufacturing and in operation, is large. The use of a thin ferroelectric layer in logic cells is found to increase the subthreshold slope.

Figure 5:
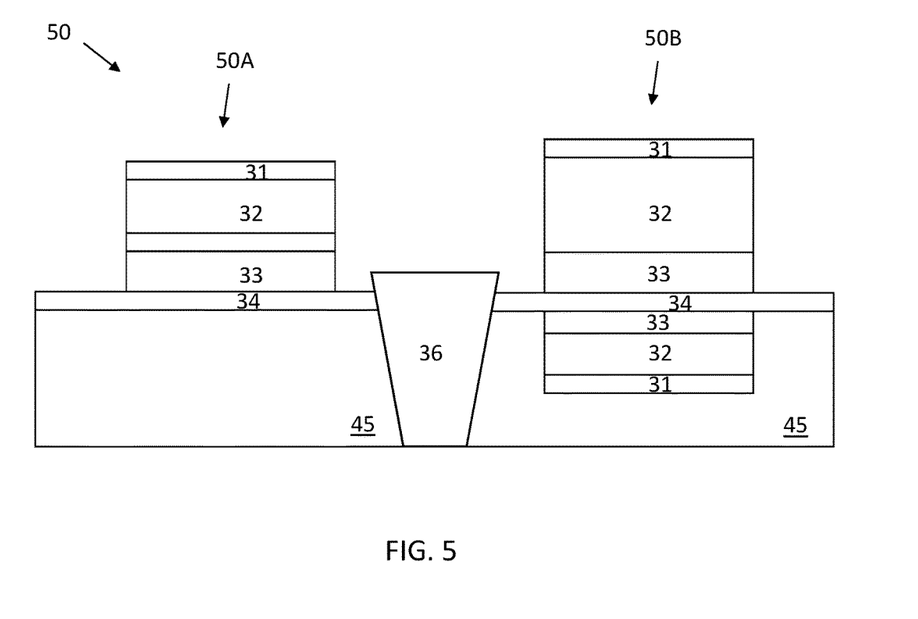
FIG. 5 illustrates a possible configuration combining a FeFET memory device according to embodiments of the present disclosure with a logic device.

FIG. 5 illustrates a possible embodiment of such combination 50 of both a logic device 50A and a memory cell according to embodiments of the present disclosure 50B both comprising a ferroelectric layer 32. The logic device 50A of FIG. 5 comprises a stack of horizontal layers: a 2D layer 33, a high-k layer 34, a ferroelectric layer 32 and a metal gate layer 31. The logic device 50A comprises a thinner ferroelectric layer 32 compared to the ferroelectric layer of the memory device 50B. This is necessary as the ferroelectric layer is now only meant to increase the subthreshold slope (SS) of the device (no remnant switching). The memory device 50B has a symmetrical structure around the 2D semiconductor layer 34 in order to remove the depolarization field. A top and bottom stack are present comprising a high-k layer 33 and a ferroelectric layer 32, the high-k layer 33 being sandwiched in between the 2D semiconductor layer 34 and the ferroelectric layer 32. On the ferroelectric layer at both sides a metal gate layer 31 is present. With this symmetrical structure two bits can be stored, or alternatively the bottom stack can be used just for reading (sensing) the device and thereby utilizing a thinner ferroelectric layer. The top stack can then be used for writing.

In a further aspect, the present disclosure relates to a method of manufacturing a non-volatile memory cell according to embodiments of the present disclosure. The method comprises:

providing a substrate 45;
    providing a high-k layer or metal layer 34 on the substrate 45;
    providing a 2D semiconductor channel layer 33 on top of the high-k layer 34;
    providing a ferroelectric layer 32 on top of the 2D semiconductor channel layer 33.

The method may furthermore comprise providing source and drain regions 41, 43 in the substrate, providing a gate electrode 31 on top of the ferroelectric material 32 and providing source and drain electrodes 43, 44 respectively, on the source and drain regions 41, 42.

The materials used in the method according to embodiments of the present disclosure may be as set out above, in embodiments of earlier-described aspects of the disclosure.

It is an advantage of using transition metal chalcogenides in method embodiments of the present disclosure, as these can withstand high temperatures, for instance high temperatures required to provide the ferroelectric layer 32 such as for example depositing a high-k layer in an orthorhombic phase.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A non-volatile memory device comprising:
    a high dielectric constant (high-k) layer or a metal layer on a semiconductor substrate;
    a two-dimensional (2D) semiconductor channel layer interposed between the high-k layer or the metal layer and a ferroelectric layer,
    wherein the high-k layer has a dielectric constant that is greater than a dielectric constant of the ferroelectric layer;
    a metal gate layer on the ferroelectric layer; and
    a source region and a drain region formed in and contacting the semiconductor substrate, each of the source region and the drain region being electrically coupled to the 2D semiconductor channel layer.

2. The non-volatile memory device of claim 1, wherein the 2D semiconductor channel layer is formed of a 2D semiconductor material having a bandgap that is greater than a bandgap of graphene.

3. The non-volatile memory device of claim 2, wherein the 2D semiconductor material has a thickness such that a conductivity of the 2D semiconductor material can be controlled by a field-induced modulation of minority carrier concentration in the 2D semiconductor material.

4. The non-volatile memory device of claim 3, wherein the thickness of the 2D semiconductor material is between 1 monolayer and 1 nm.

5. The non-volatile memory device of claim 1, wherein the 2D semiconductor channel layer comprises a transition metal chalcogenide having a chemical composition expressed as $MX_2$, wherein M is a transition metal element and X is a chalcogenide element.

6. The non-volatile memory device according to claim 5, wherein the transition metal chalcogenide is selected from the group consisting of $MoS_2$, $MoSe_2$, $WS_2$, $WSe_2$, and combinations thereof.

7. The non-volatile memory device of claim 1, wherein the 2D semiconductor channel layer is in direct contact with the ferroelectric layer on one side and in direct contact with the high-k layer on the other side.

8. The non-volatile memory device of claim 1, wherein the high-k layer comprises strontium titanate (STO).

9. The non-volatile memory device of claim 1, wherein the ferroelectric layer comprises $HfO_2$.

10. The non-volatile memory device of claim 1, wherein relative positions of the 2D semiconductor channel layer, the base layer and the ferroelectric layer are such that a depolarization field opposing a polarization electric field in in the ferroelectric layer is suppressed.

11. The non-volatile memory device of claim 1, wherein the 2D semiconductor channel layer, the ferroelectric layer and the metal gate are successively formed on a first side of base layer, and wherein the memory device further comprises a second 2D semiconductor channel layer, a second ferroelectric layer and a second metal gate that are successively formed on a second side of the base layer opposite the first side.

12. A method of fabricating a non-volatile memory cell, the method comprising:
    providing a high dielectric constant (high-k) layer on a semiconductor substrate;
    providing a 2D semiconductor layer on the high-k layer;
    providing a ferroelectric layer on the 2D semiconductor layer;
    wherein the high-k layer has a dielectric constant that is greater than a dielectric constant of the ferroelectric layer;
    providing a metal gate layer on the ferroelectric layer;
    providing a source region and a drain region in and contacting the semiconductor substrate each of the source region and the drain region being electrically coupled to the 2D semiconductor channel layer.

13. The method of claim 12, wherein the 2D semiconductor layer comprises a transition metal chalcogenide having a composition expressed as $MX_2$, wherein M is a transition metal element and X is a chalcogenide element.

14. The method of claim 12, wherein providing the 2D semiconductor layer comprises exfoliating or depositing by atomic layer deposition (ALD).

15. A non-volatile memory device comprising:
    a substrate;
    a high-k layer formed on the substrate;
    a chalcogenide layer formed on the high-k layer and configured to serve as a channel layer;
    a bistable ferroelectric memory layer formed on the chalcogenide layer and configured to undergo a polarization under an electric field;
    wherein the high-k layer has a dielectric constant that is greater than a dielectric constant of the bistable ferroelectric memory layer;
    a gate layer formed on the on the bistable ferroelectric layer; and
    a source region and a drain region formed in and contacting the substrate, each of the source region and the drain region being electrically coupled to the chalcogenide layer.

16. The non-volatile memory device of claim 15, wherein the chalcogenide layer is formed of five monolayers or less of a layered material.

17. The non-volatile memory device of claim 15, wherein the chalcogenide layer is formed of a material selected from the group consisting of $MoS_2$, $MoSe_2$, $WS_2$, $WSe_2$, and combinations thereof.

18. The non-volatile memory device of claim 17, wherein the high-k layer comprises strontium titanate (STO).

19. The non-volatile memory device of claim 17, wherein the bistable ferroelectric memory layer comprises $HfO_2$.

20. The non-volatile memory device of claim 17, wherein k values and thicknesses of the high-k layer and the bistable ferroelectric memory layer are configured such that the EOT of the high-k layer is greater than the EOT of the bistable ferroelectric memory layer by a factor exceeding 10.

21. A non-volatile memory device comprising:
a metal layer directly on a semiconductor substrate;
a two-dimensional (2D) semiconductor channel layer interposed between the metal layer and a ferroelectric layer, wherein the 2D semiconductor channel layer is directly on the metal layer;
a metal gate layer on the ferroelectric layer; and
a source region and a drain region formed in and contacting the semiconductor substrate, each of the source region and the drain region being electrically coupled to the 2D semiconductor channel layer.

22. The non-volatile memory device of claim 21, wherein the metal layer comprises one of TiN, TaN, Cu, Al or W.

* * * * *

UNITED STATES PATENT AND TRADEMARK OFFICE
CERTIFICATE OF CORRECTION

PATENT NO.       : 10,211,312 B2
APPLICATION NO.  : 15/230289
DATED            : February 19, 2019
INVENTOR(S)      : Van Houdt et al.

Page 1 of 1

It is certified that error appears in the above-identified patent and that said Letters Patent is hereby corrected as shown below:

In the Specification

Column 7, Line 9, change "nm" to --nm.--.

Column 7, Line 35, change "oxide" to --oxide.--.

In the Claims

Column 10, Line 4, in Claim 10, change "in in" to --in--.

Column 10, Line 48, in Claim 15, change "on the on the" to --on the--.

Signed and Sealed this
Fourth Day of June, 2019

Andrei Iancu
*Director of the United States Patent and Trademark Office*